United States Patent
Kim et al.

(10) Patent No.: US 9,318,356 B2
(45) Date of Patent: Apr. 19, 2016

(54) SUBSTRATE STRIP

(71) Applicant: SAMSUNG ELECTRO-MECHANICS CO., LTD., Suwon (KR)

(72) Inventors: Joong Sun Kim, Daejeon (KR); Sang Gab Park, Cheongju (KR); Kwang Seop Youm, Yeongi (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 147 days.

(21) Appl. No.: 14/079,024

(22) Filed: Nov. 13, 2013

(65) Prior Publication Data

US 2014/0240949 A1    Aug. 28, 2014

(30) Foreign Application Priority Data

Feb. 22, 2013  (KR) .................. 10-2013-0019129

(51) Int. Cl.
*H05K 7/00* (2006.01)
*H01L 21/56* (2006.01)
*H01L 23/498* (2006.01)
*H01L 23/00* (2006.01)
*H01L 23/31* (2006.01)

(52) U.S. Cl.
CPC ........ *H01L 21/561* (2013.01); *H01L 23/49838* (2013.01); *H01L 23/3107* (2013.01); *H01L 24/97* (2013.01)

(58) Field of Classification Search
USPC .................................................. 361/777, 820
See application file for complete search history.

(56) References Cited

U.S. PATENT DOCUMENTS 5,677,575 A * 10/1997 Maeta et al. .................. 257/778
6,198,165 B1 * 3/2001 Yamaji et al. ................. 257/734

FOREIGN PATENT DOCUMENTS

| JP | 2006-108289 | 4/2006 |
| JP | 2008-004631 | 1/2008 |
| JP | 2009-290080 | 12/2009 |
| KR | 10-2006-0065245 | 6/2006 |
| KR | 10-2011-0017138 | 2/2011 |

OTHER PUBLICATIONS

Japanese Office Action mailed Dec. 24, 2014 in corresponding Japanese Application No. 2013-234019.
Korean Office Action issued Apr. 28, 2014 in corresponding Korean Patent Application No. 10-2013-0019129.

* cited by examiner

*Primary Examiner* — Andargie M Aychillhum
(74) *Attorney, Agent, or Firm* — NSIP Law

(57) ABSTRACT

Disclosed herein is a substrate strip including: a substrate region having a plurality of substrate units formed therein; a dummy region enclosing the substrate region; a plurality of metal patterns formed at a predetermined size in the dummy region; and rib patterns formed between the metal patterns.

10 Claims, 3 Drawing Sheets

SUBSTRATE STRIP

CROSS REFERENCE(S) TO RELATED APPLICATIONS

This application claims the benefit under 35 U.S.C. Section 119 of Korean Patent Application Serial No. 10-2013-0019129, entitled "Substrate Strip" filed on Feb. 22, 2013, which is hereby incorporated by reference in its entirety into this application.

BACKGROUND OF THE INVENTION

1. Technical Field

The present invention relates to a substrate strip, and more particularly, to a substrate strip in which units having semiconductor chips mounted thereon are disposed in at least one row.

2. Description of the Related Art

Generally, several tens to several hundreds of chips may be formed per one wafer. However, the chip itself may not receive electricity supplied from the outside to transmit and receive an electric signal. In addition, since the chip includes fine circuits, it is easily damaged due to external impact.

Therefore, a packaging technology of performing electrical connection to the chips and protecting the chips from the external impact has been gradually developed.

Recently, demands for high integration of a semiconductor device, an increase in memory capacity, multi-functionalization, high density mounting, and the like, have increased. In order to satisfy these demands, a bonding structure is changed from a bonding structure using wire bonding to a bonding structure using a flip chip bump. In a structure performing a high-end level function among these structures, a bump is formed in a substrate strip state in order to improve an assembly yield.

Here, the substrate strip means that substrate units having semiconductor chips mounted thereon are disposed and connected to each other in at least one row and includes the substrate units on which the semiconductor chips are mounted and a dummy region formed in the vicinity of the substrate units.

This substrate strip has been mainly utilized in a packaging process of a semiconductor device.

The package process of a semiconductor device includes a process of mounting a semiconductor chip on a substrate unit of the substrate strip, a process of molding the substrate strip using a molding material, and a process of cutting the substrate strip into each substrate unit, and the like.

In the process of molding the substrate strip according to the related art, the substrate unit is covered by a molding clamp, and the molding material is injected into the molding clamp to perform the molding.

In this case, deformation such as warpage, torsion, and the like, occurs in the substrate strip due to thermal stress and moisture absorption generated at the time of manufacturing the substrate strip, and a prominence-depression is formed at the time of applying a solder resist. Close adhesion force between the substrate strip and the molding clamp is decreased due to the deformation of the substrate strip and the prominence-depression of the solder resist, the molding material is leaked through a gap between the substrate strip and the molding clamp in a molding process, such that flat molding is not performed, and problems such as a molding defect that the molding material is leaked to the dummy region, a molding apparatus fault, and the like, occur.

RELATED ART DOCUMENT

Patent Document (Patent Document 1) Korean Patent Laid-Open Publication No. 2011-0017138

SUMMARY OF THE INVENTION

An object of the present invention is to provide a substrate strip capable of preventing a defect generated in a molding process by flattening a surface of a dummy region thereof.

According to an exemplary embodiment of the present invention, there is provided a substrate strip including: a substrate region having a plurality of substrate units formed therein; a dummy region enclosing the substrate region; a plurality of metal patterns formed at a predetermined size in the dummy region; and rib patterns formed between the metal patterns.

The metal pattern may include: a plurality of first metal patterns arranged at predetermined intervals; and second metal patterns formed between the first metal patterns.

The metal pattern may be formed in a circular shape.

The first metal pattern may have a diameter of 500 to 650 μm.

The second metal pattern may have a diameter smaller than that of the first metal pattern.

The second metal pattern may have a diameter corresponding to ⅓ to ½ of the diameter of the first metal pattern.

The metal pattern may be formed in a polygonal shape.

The first metal pattern may have an area of 0.78 to 1.32 mm$^2$.

The second metal pattern may have an area smaller than that of the first metal pattern.

The rib pattern may connect the metal patterns to each other.

The rib pattern may be formed in a straight line shape so as to have a width of 90 to 100 μm.

The metal patterns and the rib patterns may occupy 50 to 70% of the entire area of the dummy region.

The metal pattern and the rib pattern may be made of a copper material.

DESCRIPTION OF THE PREFERRED EMBODIMENTS

Hereinafter, exemplary embodiments of the present invention will be described with reference to the accompanying drawings. However, the exemplary embodiments are described by way of examples only and the present invention is not limited thereto.

In describing the present invention, when a detailed description of well-known technology relating to the present invention may unnecessarily make unclear the spirit of the present invention, a detailed description thereof will be omitted. Further, the following terminologies are defined in consideration of the functions in the present invention and may be construed in different ways by the intention of users and operators. Therefore, the definitions thereof should be construed based on the contents throughout the specification.

As a result, the spirit of the present invention is determined by the claims and the following exemplary embodiments may be provided to efficiently describe the spirit of the present invention to those skilled in the art.

Hereinafter, an exemplary embodiment of the present invention will be described in detail with reference to the accompanying drawings.

Figure 1:
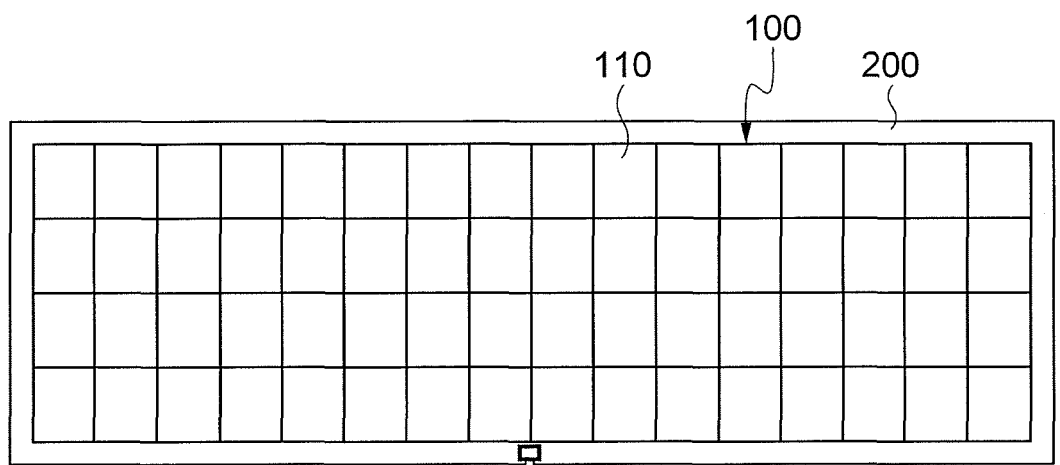
FIG. 1 is a plan view showing a substrate strip according to a first exemplary embodiment of the present invention.
Figure 1:
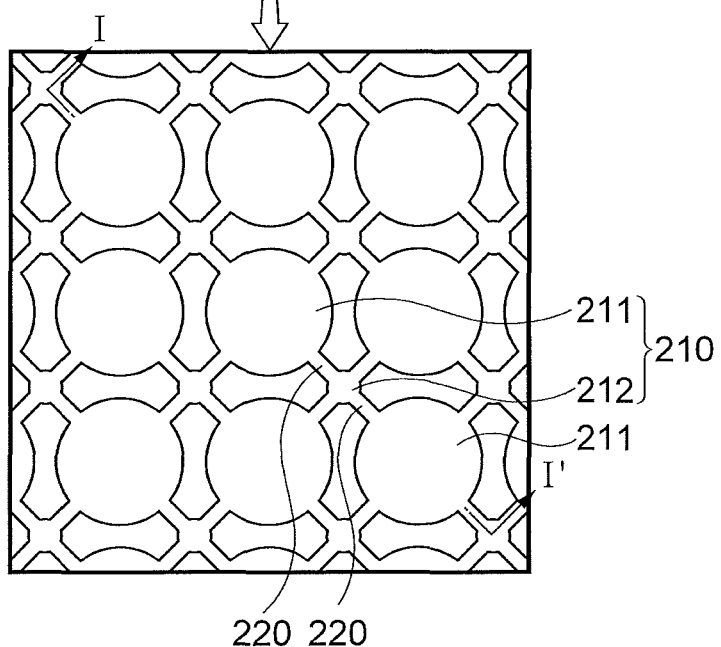
Figure 2:
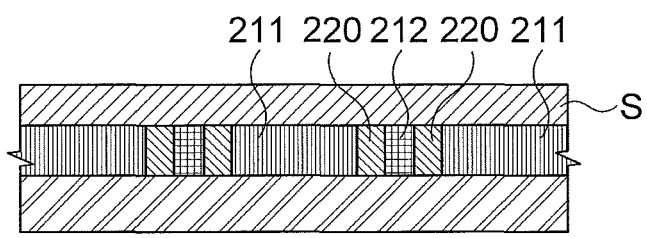
FIG. 2 is a cross-sectional view taken along the line I-I'.

FIG. 1 is a plan view showing a substrate strip according to a first exemplary embodiment of the present invention; and FIG. 2 is a cross-sectional view taken along the line I-I'.

As shown in FIGS. 1 and 2, the substrate strip according to the first exemplary embodiment of the present invention is configured to include a substrate region 100 having a plurality of substrate units 110 formed therein, a dummy region 200 enclosing the substrate region 100, a plurality of metal patterns 210 formed at a predetermined size in the dummy region 200, and rib patterns 220 formed between the metal patterns 210.

The substrate region 100 may include the substrate units 110 on which semiconductor chips are mounted and packaged and is a region cut to the substrate units 110 in a state in which the dummy region 200 is removed after the semiconductor chips are mounted and packaged thereon and mounted on a mother board, or the like.

Here, the substrate region 100 may have the plurality of substrate units 100 disposed in parallel with each other in a transversal direction and a longitudinal direction as shown in FIG. 1. That is, the plurality of substrate units 110 are arranged in a lattice structure, thereby making it possible to more easily cut the substrate unit 110 from the dummy region 200.

The substrate unit 110 is a part that becomes one independent printed circuit board after being manufactured.

The substrate unit 110 according to the exemplary embodiment of the present invention, which becomes a package substrate, may have at least one semiconductor chip mounted thereon and be later molded by a molding material.

Here, the substrate units 110 may have rectangular plate shapes that have the same size, include circuit patterns (not shown) formed thereon and capable of performing functions of the semiconductor chips mounted thereon, and include terminal parts (not shown) formed on a lower surface thereof so as to be connected to external terminals such as balls, leads, or the like. Here, a structure of the substrate unit 100 may be variously set according to the intention of a designer.

The dummy region 200, which is to facilitate handling of the substrate strip in a process of manufacturing the substrate strip, may be formed to enclose the circumference of the substrate region 100 and be removed per each substrate unit 110 after the semiconductor chips are mounted on the substrate units 110.

Here, the dummy region 200 may be provided with a mold gate (not shown) into which the molding material is injected at the time of molding, a tooling groove (not shown) used as a reference at the time of processing the substrate strip, and an alignment mark (not shown) for mounting the semiconductor chip.

In addition, the dummy region 200 may be provided with a plurality of metal patterns 210 having a predetermined size and rib patterns 220 connecting between the metal patterns 210.

Here, the metal patterns 210 and the rib patterns 220 are formed over the entire dummy region 200 to prevent deformation such as warpage, torsion, and the like, occurring due to different coefficients of thermal expansion between components configuring the substrate strip when heat and pressure are applied to the substrate strip in the process of manufacturing the substrate strip.

Particularly, the metal pattern 210 and the rib pattern 220 may be made of the same kind of metal so as to have the same coefficient of thermal expansion as that of the circuit pattern (not shown) of the substrate unit 110. For example, the metal pattern 210 and the rib pattern 220 may be made of any one selected from a group consisting of copper (Cu), gold (Au), and silver (Ag).

Meanwhile, the metal pattern 210 may include first and second metal patterns 211 and 212 having different sizes and be formed in a circular shape.

Here, the first metal patterns 211 may be arranged at predetermined intervals in the transversal direction and the longitudinal direction, and the second metal patterns 212 may be formed between the first metal patterns 211 in a diagonal direction.

Here, the second metal pattern 212 may have a size smaller than that of the first metal pattern 211 so as to be formed between the first metal patterns 211 in the diagonal direction.

Further, the first and second metal patterns 212 may have the rib pattern 220 formed therebetween so as to connect therebetween.

Here, the rib pattern 220 may be formed in a straight line shape having a predetermined thickness and connect the first and second metal patterns 211 and 212 to thereby be formed in a closed curve shape. Meanwhile, the rib pattern 220 may be formed in a curve shape as well as the straight line shape.

That is, at the time of performing a process of applying a solder resist S, the solder resist S is confined in a closed curve formed by connecting the first and second metal patterns 211 and 212 to each other by the rib pattern 220, such that movement of the solder resist S is suppressed, thereby making it possible to minimize a deviation in a thickness of the solder resist S of the dummy region 200.

Meanwhile, in order to decrease the deviation in the thickness of the solder resist S and decrease deformation such as warpage, torsion, and the like, due to thermal stress and moisture absorption of the substrate strip, the metal patterns 210 and the rib patterns 220 may occupy 50 to 70% of the entire area of the dummy region.

To this end, in the case in which the first metal pattern 211 is formed in a circular shape, the first metal patterns 211 may have a diameter of 500 to 650 μm and the second metal pattern 212 may have a diameter smaller than that of the first metal pattern 211, for example, a diameter corresponding to ⅓ to ½ of the diameter of the first metal pattern 211. In addition, in the case in which the first metal pattern 211 is formed in a polygonal shape, the first metal pattern 211 may have an area of 0.78 to 1.32 mm². Further, the rib pattern 220 may have a width of 90 to 100 μm.

That is, the plurality of metal patterns 210 and rib patterns 220 are formed in the dummy region 220, thereby making it possible to prevent deformation such as warpage, torsion, and the like, due to thermal stress and moisture absorption of the substrate strip.

In addition, the plurality of metal patterns 210 and rib patterns 220 are formed in the dummy region 220, such that the solder resist applied to the dummy region 200 may be evenly applied without a prominence-depression at the time of being applied to the substrate strip.

Figure 3:
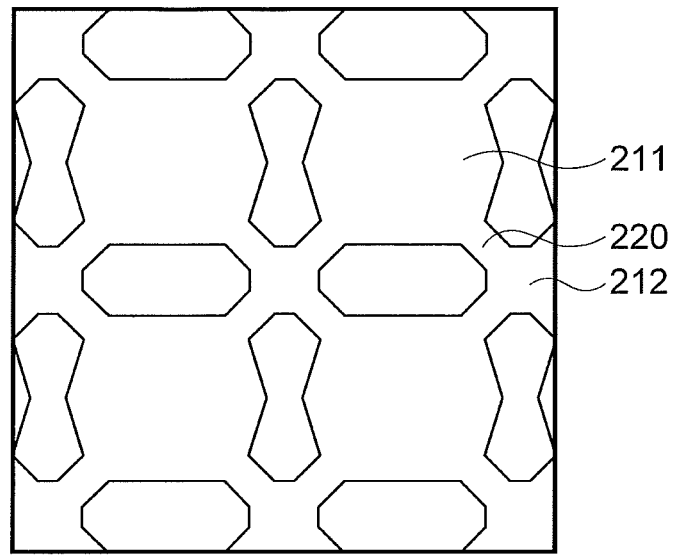
FIG. 3 is a plan view showing a substrate strip according to a second exemplary embodiment of the present invention.
Figure 4:
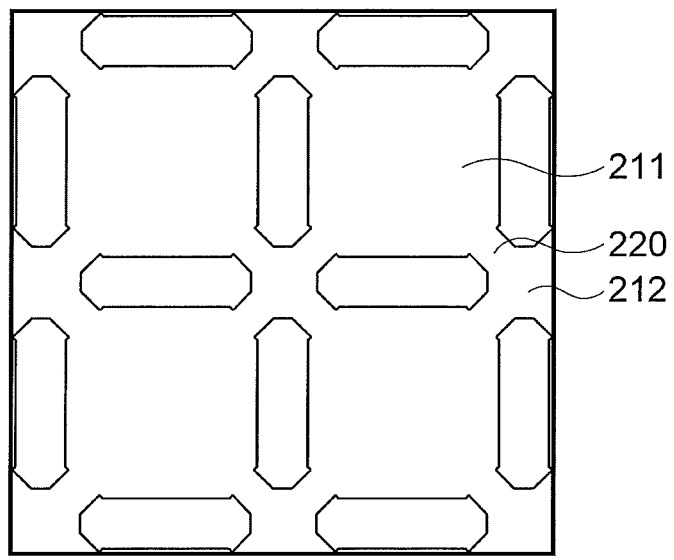
FIG. 4 is a plan view showing a substrate strip according to a third exemplary embodiment of the present invention.
Figure 5:
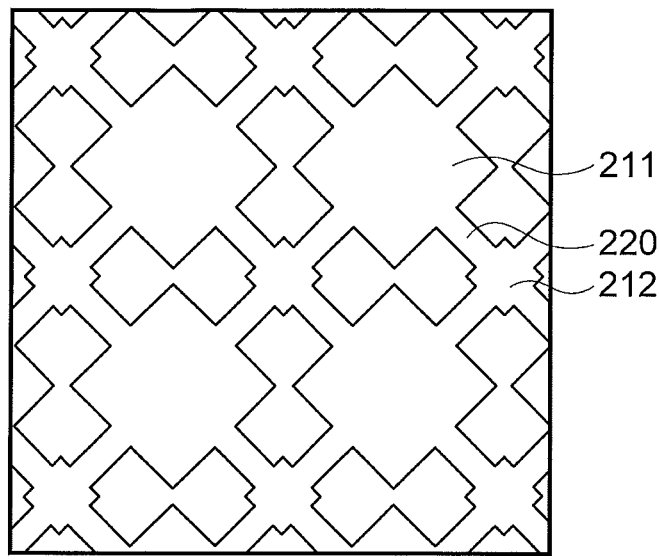
FIG. 5 is a plan view showing a substrate strip according to a fourth exemplary embodiment of the present invention.

Meanwhile, FIG. 3 is a plan view showing a substrate strip according to a second exemplary embodiment of the present invention; FIG. 4 is a plan view showing a substrate strip according to a third exemplary embodiment of the present invention; and FIG. 5 is a plan view showing a substrate strip according to a fourth exemplary embodiment of the present invention.

As shown in FIG. 3, the metal pattern 210 may be formed in a hexagonal shape. In addition, as shown in FIG. 4, the metal pattern 210 may be formed in a rectangular shape. Further, as shown in FIG. 5, the metal pattern 210 may be formed in a diamond shape.

Figure 6:
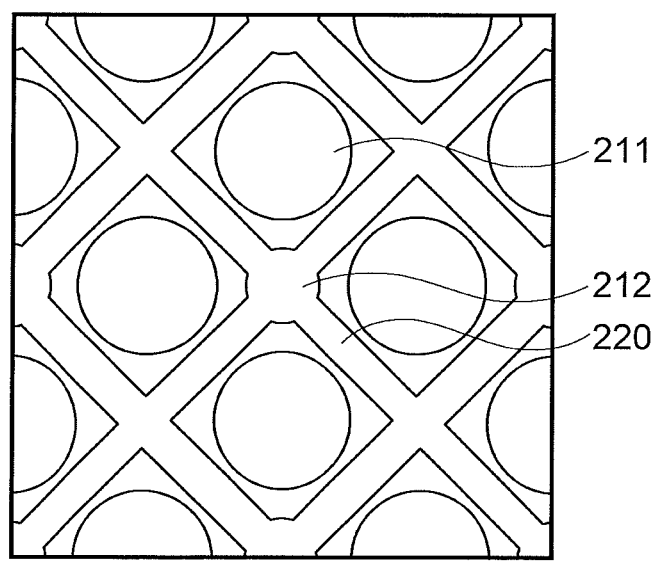
FIG. 6 is a plan view showing a substrate strip according to a fifth exemplary embodiment of the present invention.

In addition, FIG. 6 is a plan view showing a substrate strip according to a fifth exemplary embodiment of the present invention. The rib patterns 220 may also be formed so that the second metal patterns 212 are connected to each other and the first metal patterns 211 are positioned therein. In this case, the rib patterns 220 are formed in the closed curve shape as described above, thereby making it possible to suppress the movement of the solder resist S at the time of applying the solder resist S.

Therefore, the substrate strip according to the exemplary embodiment of the present invention suppresses the movement of the solder resist S of the dummy region 200 to minimize a deviation in a thickness, such that the substrate strip is closely adhered to a molding clamp contacting the dummy region 200 of the substrate strip without a gap at the time of performing a molding process, thereby making it possible to prevent a molding material from being leaked onto the dummy region. Therefore, a defect due to a molding deviation that the molding material is concentrated only on a partial region may be decreased, and a fault of a molding apparatus due to the leakage of the molding material may be prevented.

As set forth above, the substrate strip according to the exemplary embodiment of the present invention includes the metal patterns and the rib patterns formed in the dummy region, thereby making it possible to prevent deformation such as warpage, torsion, and the like, due to thermal stress and moisture absorption of the substrate strip.

In addition, the molding clamp is closely adhered to the substrate strip at the time of performing the molding process, thereby making it possible to prevent the molding material from being leaked to the dummy region. Therefore, a defect due to a molding deviation may be decreased, and a fault of a molding apparatus may be prevented.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, the scope of the present invention is not construed as being limited to the described embodiments but is defined by the appended claims as well as equivalents thereto.

What is claimed is:

1. A substrate strip comprising:
a substrate region; a dummy region enclosing the circumference of a substrate region; metal patterns, wherein each metal pattern has a predetermined size and is disposed in the dummy region; and rib patterns, wherein each rib pattern connects a metal pattern to another metal pattern, wherein first metal patterns having a first predetermined size and disposed at predetermined intervals; and second metal patterns having a second predetermined size and disposed at predetermined intervals between the first metal patterns, wherein each of the first and second metal patterns comprises a polygonal shape, wherein each of the second metal patterns has an area smaller than an area of each of the first metal patterns.

2. The substrate strip according to claim 1, wherein each of the first and second metal patterns comprises a circular shape.

3. The substrate strip according to claim 2, wherein each of the first metal patterns has a diameter of about 500 μm to about 650 μm.

4. The substrate strip according to claim 2, wherein each of the second metal patterns has a diameter smaller than that of the first metal patterns.

5. The substrate strip according to claim 2, wherein each of the second metal patterns has a diameter of about ⅓ to about ½ of the diameter of the first metal patterns.

6. The substrate strip according to claim 1, wherein each of the first metal patterns has an area of about 0.78 mm² to about 1.32 mm².

7. The substrate strip according to claim 1, wherein each rib pattern comprises a straight line shape comprising a width of about 90 μm to about 100 μm.

8. The substrate strip according to claim 1, wherein the pattern occupies an area of about 50% to about 70% of the entire area of the dummy region.

9. The substrate strip according to claim 1, wherein the pattern comprises a copper material.

10. A substrate strip comprising:
a dummy region enclosing the circumference of a substrate region; and a pattern of metal elements repeatedly disposed on the dummy region; wherein the pattern comprises a rib element configured to connect a first metal element to a second metal element, wherein first metal patterns having a first predetermined size and disposed at predetermined intervals; and second metal patterns having a second predetermined size and disposed at predetermined intervals between the first metal patterns, wherein each of the second metal patterns has an area smaller than an area of each of the first metal patterns.

* * * * *